(12) United States Patent
Yoder

(10) Patent No.: US 7,161,170 B1
(45) Date of Patent: Jan. 9, 2007

(54) DOPED-ABSORBER GRADED TRANSITION ENHANCED MULTIPLICATION AVALANCHE PHOTODETECTOR

(75) Inventor: Paul Douglas Yoder, Richmond Hill, GA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 0 days.

(21) Appl. No.: 10/735,494

(22) Filed: Dec. 12, 2003

Related U.S. Application Data

(60) Provisional application No. 60/432,926, filed on Dec. 12, 2002.

(51) Int. Cl.
*H01L 27/15* (2006.01)
(52) U.S. Cl. ......................................... 257/21; 257/85
(58) Field of Classification Search .................. 257/21, 257/22, 185, 186, 191, 438–440
See application file for complete search history.

(56) References Cited

U.S. PATENT DOCUMENTS

| | | | | |
|---|---|---|---|---|
| 5,912,478 A | * | 6/1999 | Barrou et al. ............... | 257/185 |
| 6,218,684 B1 | * | 4/2001 | Kuhara et al. ............... | 257/184 |
| 2003/0111675 A1 | * | 6/2003 | Yao ............................. | 257/233 |
| 2004/0251483 A1 | * | 12/2004 | Ko et al. ..................... | 257/292 |
| 2005/0029541 A1 | * | 2/2005 | Ko .............................. | 257/186 |
| 2005/0167709 A1 | * | 8/2005 | Augusto ..................... | 257/292 |

* cited by examiner

*Primary Examiner*—Thomas L. Dickey
(74) *Attorney, Agent, or Firm*—Christie, Parker & Hale

(57) ABSTRACT

An InGaAs/InAlAs-based avalanche photodetector provides high gain and high bandwidth over a range of operating biases. A graded transition region alleviates the barrier to electron transport from the absorption region to the multiplication region when an operating bias is applied. The graded transition region is a graded bandgap material with a relatively wide bandwidth in the region closer to the multiplication region and a relatively narrow bandgap in the region closer to the absorption region. In another embodiment, a p-type dopant profile is introduced within the absorption layer to produce an electrostatic field which accelerates electrons towards the multiplication region. In another embodiment, a bi-level multiplication region with a wide bandgap ternary layer and a narrower bandgap quarternary layer is provided at an increased thickness to improve gain per unit length.

17 Claims, 2 Drawing Sheets

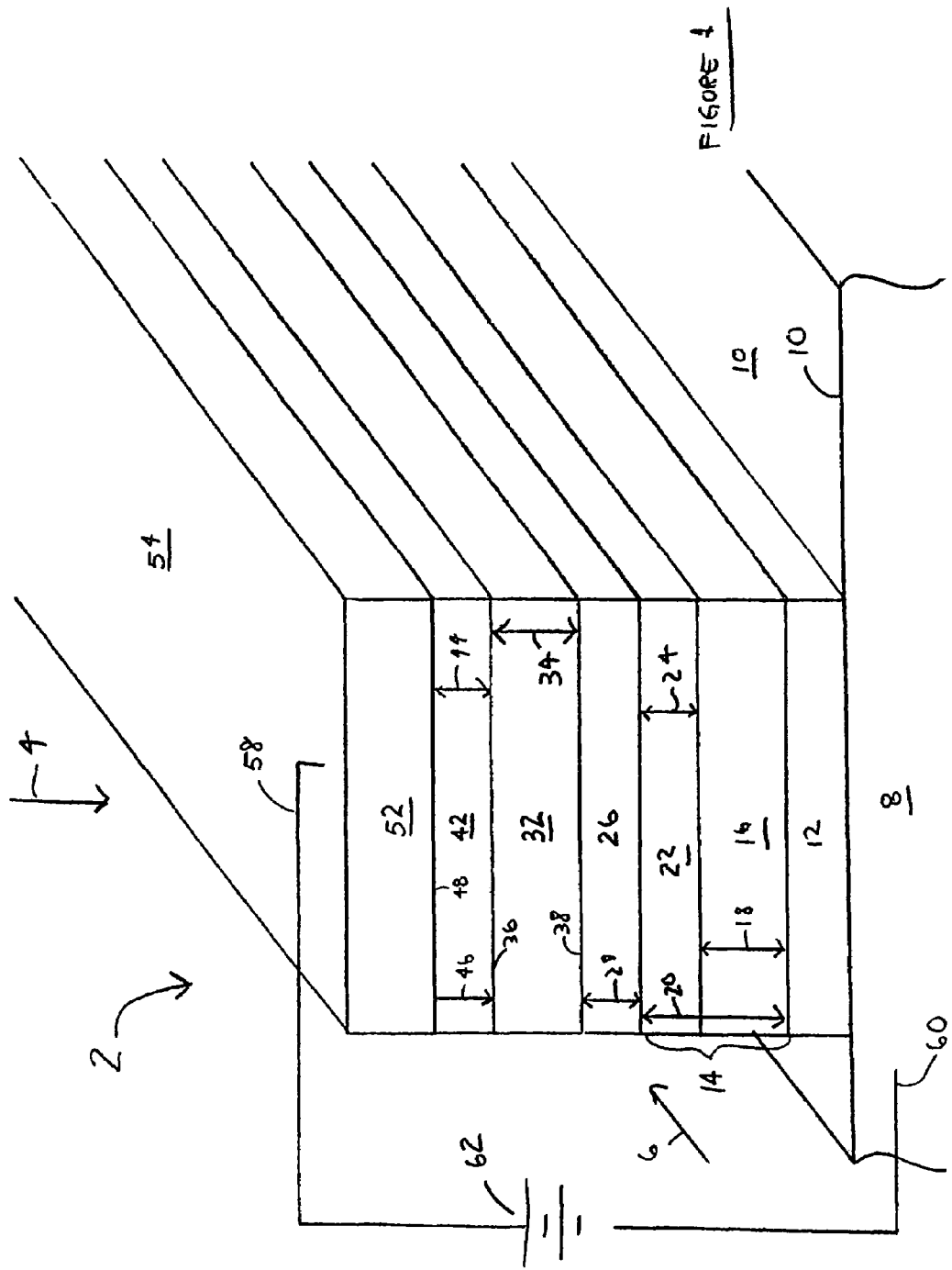

ZERO APPLIED BIAS

AT OPERATING BIAS

DOPED-ABSORBER GRADED TRANSITION ENHANCED MULTIPLICATION AVALANCHE PHOTODETECTOR

CROSS-REFERENCE TO RELATED APPLICATION

This application claims the benefit U.S. Provisional Application No. 60/432,926, filed Dec. 12, 2002, the contents of which are incorporated fully herein.

FIELD OF THE INVENTION

The present invention relates generally to optoelectronic communication systems. More particularly, the present invention relates to an avalanche photodetector and the process for forming the same.

BACKGROUND OF THE INVENTION

Avalanche photodetectors (APDs) are used in a wide variety of applications in today's advancing optoelectronics industry. For example, avalanche photodetectors are commonly used as optical monitors and optical receivers.

When light, i.e., an optical signal, is directed to and absorbed by an absorption layer of an APD, electron-hole pairs are created and an electrical current is generated thereby converting the optical signal to an electrical signal. It is desirable to produce APDs with high quantum efficiency, high gain and high bandwidth over a wide range of bias voltages.

An avalanche photodetector includes at least an absorption layer in which light is absorbed and electron-hole pairs are produced and a multiplication region in which avalanche multiplication takes place. In the multiplication region, electrons are accelerated through electric fields, gain energy and form additional electron-hole pairs, liberating additional electrons. The multiplication region is therefore seen to be the region in which gain occurs.

Previous attempts to produce high gain, high bandwidth APDs over a wide range of bias voltages include the reduction of absorption and/or multiplication layer thicknesses to improve bandwidth and the use of a superlattice rather than a homogeneous material as the multiplication region, to enhance gain. An undesired consequence of the reduction of absorption layer thickness is lower quantum efficiency. Gain, achieved in a multiplication region, must compensate for this loss in quantum efficiency. Decreasing the width of the multiplication region to improve bandwidth performance, however, also lowers the maximum achievable gain. Neither of the two approaches of reducing absorption and/or multiplication layer thicknesses, however, address the bandwidth-limiting problems and produce an APD with a suitably high bandwidth. Although a superlattice structure achieves more avalanche gain per unit length than a homogeneous material, it is unlikely that such superlattice structures are optimal in this regard, especially in relatively short multiplication regions. This is due, in part, to the fact that electron-hole pairs do not remain in the relatively low bandgap layers of the multiplication region in a superlattice structure, long enough to exploit the increase in input ionization probability attained when an electron accelerates through the multiplication region. Additionally, the use of a superlattice structure may produce dark current effects that can adversely affect the signal.

InGaAs/InAlAs-based avalanche photodetectors are favored in today's optoelectronics communication industry because of the familiarity and availability of the materials and methods used to form such photodetectors.

It can be therefore understood that it would be desirable to produce an InGaAs/InAlAs-based avalanche photodetector with both high gain and high bandwidth over a wide range of bias voltages without the aforementioned trade-offs and shortcomings that can limit gain and/or quantum efficiency.

SUMMARY OF THE INVENTION

According to one exemplary embodiment, the present invention provides an avalanche photodetector including an absorption layer, a multiplication region including at least one multiplication layer, and a graded transition region between the absorption layer and the multiplication region. The graded transition region is a graded-bandgap region including a graded conduction band energy level that produces a gradual change between the conduction band energy level of the absorber layer and a conduction band energy level of the multiplication region. Together with an applied operating bias, the graded transition region alleviates the barrier to electron transport that exists due to the potential energy difference between the absorption layer and the multiplication region.

According to another exemplary embodiment, the present invention provides an avalanche photodetector including an absorption layer having a top and a bottom, and a multiplication region facing the bottom of the absorption layer and including at least one multiplication layer. The absorption layer includes a P-type dopant impurity therein, and includes a concentration gradient of the P-type dopant impurity that decreases from the top to the bottom of the absorption layer.

According to yet another exemplary embodiment, the present invention provides an avalanche photodetector that includes an absorption layer, a multiplication region, and a charge layer situated between the multiplication region and the absorption layer. The multiplication region consists of two multiplication layers. The two multiplication layers are a relatively wide bandgap material multiplication layer that is situated closer to the absorption layer and a relatively narrow bandgap material multiplication layer that is further from the absorption layer. The combined thickness of the two multiplication layers is at least 0.1 micron.

BRIEF DESCRIPTION OF THE DRAWINGS

The present invention is best understood from the following detailed description when read in conjunction with the accompanying drawing. It is emphasized that, according to common practice, the various features of the figures are not to-scale. On the contrary, the dimensions of the various features are arbitrarily expanded or reduced for clarity. Like numerals denote like figures throughout the specification and drawing. Included are the following figures:

FIG. 1 is a cross-sectional, perspective view of an avalanche photodetector according to the present invention;

DETAILED DESCRIPTION OF THE INVENTION

Figure 2A:
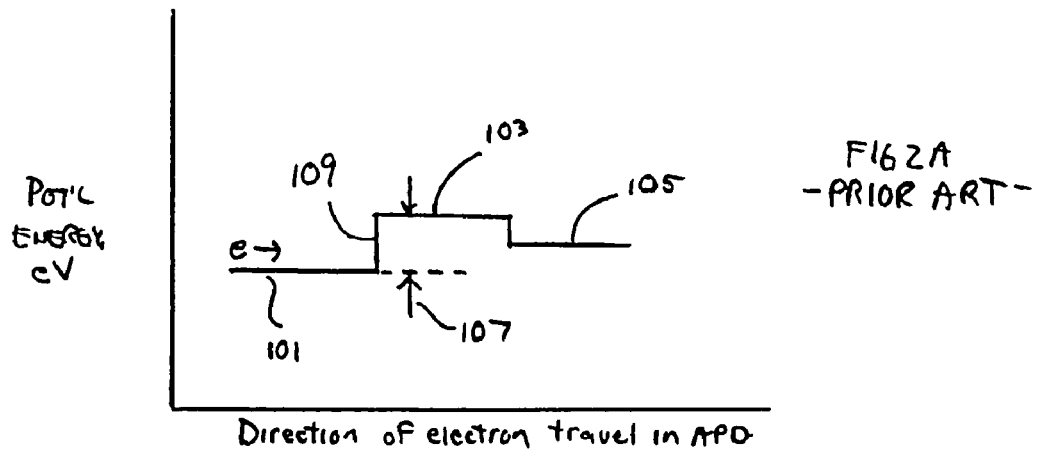
FIG. 2A is a graphical representation of conduction band energy levels of the layers of an APD according to the Prior Art.

In one exemplary embodiment, the present invention provides an APD including a graded transition region formed between an absorption layer and the multiplication region of the APD. This graded-bandgap, graded transition region, in conjunction with an applied operating bias, helps to overcome the potential energy barrier an electron must overcome in traversing from the absorption layer to the multiplication region. In another exemplary embodiment, the present invention provides a P-type dopant impurity introduced into the absorption region of an APD to move the P-side depletion region edge closer to the multiplication region. The P-type dopant impurity concentration includes a gradient that decreases within the absorption layer along the direction towards the multiplication region. According to another exemplary embodiment, the present invention provides a relatively wide, two layer multiplication region to increase gain in the multiplication region. The present invention therefore provides an APD that may include either or all of the aforementioned embodiments of the invention.

FIG. 1 is a cross-sectional, perspective view of an exemplary avalanche photodetector (APD) according to the present invention. APD 2 is formed on substrate 8 and, in one embodiment, may be cleaved such that the cross-sectional view shown in FIG. 1 represents a physical end of APD 2. Substrate 8 may be a silicon, indium phosphide, or gallium arsenide or other suitable substrate material. The light to be detected by APD 2 may be directed along direction 4, substantially orthogonal to surface 10 of substrate 8, or light may be directed along direction 6, essentially parallel to surface 10 of substrate 8. In fact, light may be directed to APD 2 along any of various other directions, in other exemplary embodiments.

Avalanche photodetector 2 includes lower layers 12, multiplication region 14 including first multiplication layer 22 and second multiplication layer 16, charge layer 26, absorption layer 42 and upper layers 52. In the illustrated embodiment, avalanche photodetector 2 also includes graded transition region 32 interposed between absorption layer 42 and multiplication region 14. More particularly, graded transition region 32 is disposed between charge layer 26 and absorption layer 42. Although illustrated in FIG. 1, graded transition region 32 represents one exemplary embodiment of the present invention and, as such, may not be present in all embodiments, such as the exemplary embodiment in which only the feature of the optimally doped absorption layer is utilized, or the exemplary embodiment in which multiplication region 14 is divided into one relatively wide-bandgap subregion and one relatively narrow-bandgap subregion. In other words, the feature of graded transition region 32 may be used in conjunction with embodiments in which absorption layer 42 is not doped, and along with embodiments in which multiplication region 14 is represented by a single multiplication region or a superlattice of individual multiplication layers. Similarly, the feature of the bi-level multiplication region partitioned into one relatively wide-bandgap layer and one relatively narrow-bandgap layer may be used in conjunction with embodiments that do not include graded transition region 32. In summary, although each of the aforementioned inventive embodiments are illustrated in FIG. 1, each may be used in conjunction with other avalanche photodetectors.

Each of the layers may be formed in sequence using epitaxial methods such MBE (molecular beam epitaxy), vapor phase epitaxy, liquid phase epitaxy, or other suitable and commercially available film formation/deposition techniques. Upper layers 52 may represent a plurality of layers that may include cladding layers, optical waveguide layers, and/or other layers. In the case in which light is incident upon APD 2 along direction 4, upper layers 52 will advantageously be formed of materials transmissive to the wavelength of light desired to be detected. Upper layers 52 may include upper surface 54 being a conductive material to which an electrical connection can be made to provide an operating bias to avalanche photodetector 2. For example, power supply 62 may be connected to upper layers 52 by means of conductive lead 58 and power supply 62 may be further electrically coupled to substrate 8 which may include a conductive layer formed thereon or thereunder (not shown) by means of conductive lead 60. In this manner, an operating bias can be applied to avalanche photodetector 2. Lower layers 12 may include cladding layers, waveguide layers, and other layers and, like upper layers 52, the particulars of lower layers 12 will depend upon the particular application of APD 2.

Light is absorbed in absorption region 42, photoexciting electron-hole pairs. When electrons generated within absorption region 42 reach multiplication region 14, avalanche multiplication takes place and gain occurs. That is, a single electron causes the liberation of multiple electrons. Charge layer 26 is a relatively thin and heavily doped layer used to affect an abrupt step in electric field strength to assist electron acceleration within multiplication region 14. Charge layer 26 is generally formed of the same material as the adjacent multiplication layer, but is distinguished from the adjacent multiplication layer, that is, first multiplication layer 22 in the illustrated embodiment, by a heavy dopant impurity concentration included in the charge layer.

According to one exemplary embodiment of the present invention, graded transition region 32 is provided. Graded transition region 32 is a region of a graded-bandgap material which provides a ramped energy barrier to injected electrons and the electric field opposing electron motion from absorption layer 42 to multiplication region 14 by way of charge layer 26. Under operating conditions, an applied bias is applied to avalanche photodetector 2 to generate an opposing electric field such that, in conjunction with graded transition region 32, the net effective electrical field accelerates electrons towards charge layer 26 and the multiplication region.

A significant factor limiting the low-gain bandwidth of conventional avalanche photodetectors is the abrupt heterojunction between the absorption layer and the multiplication region, more particularly, between the absorption layer and charge layer. Since the charge layer and the adjacent multiplication layer are formed of the same material and have essentially the same conduction band energy levels, and since electrons must travel from the absorption layer to the multiplication region where gain occurs, this heterojunction will be discussed in terms of the absorption layer and multiplication region. In a conventional InGaAs/InAlAs-based avalanche photodetector, the abrupt heterojunction between the InGaAs absorption region and the InAlAs multiplication region may be on the order of a 0.475 electron-volt (eV) potential barrier for electrons to overcome, which is exacerbated by unfavorable satellite valley energies on either side of the junction. According to one exemplary embodiment, absorption layer 42 may be formed of InGaAs, charge layer 26 may be formed of doped InAlAs, first multiplication layer 22 may be formed of InAlAs, and second multiplication layer 16 may be formed of InGaAlAs. Such is intended to be exemplary only, as for an InGaAs/

InAlAs-based avalanche photodetector, and the graded transition region of the present invention may be similarly applied to avalanche photodetectors formed of other materials.

Figure 2B:
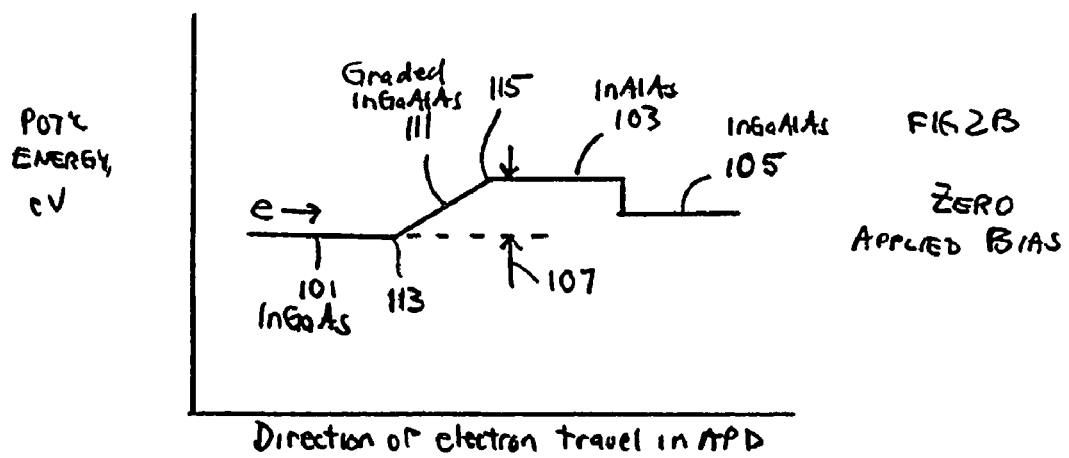
FIG. 2B is a graphical representation of conduction band energy levels of an APD of the present invention with zero applied bias.
Figure 2C:
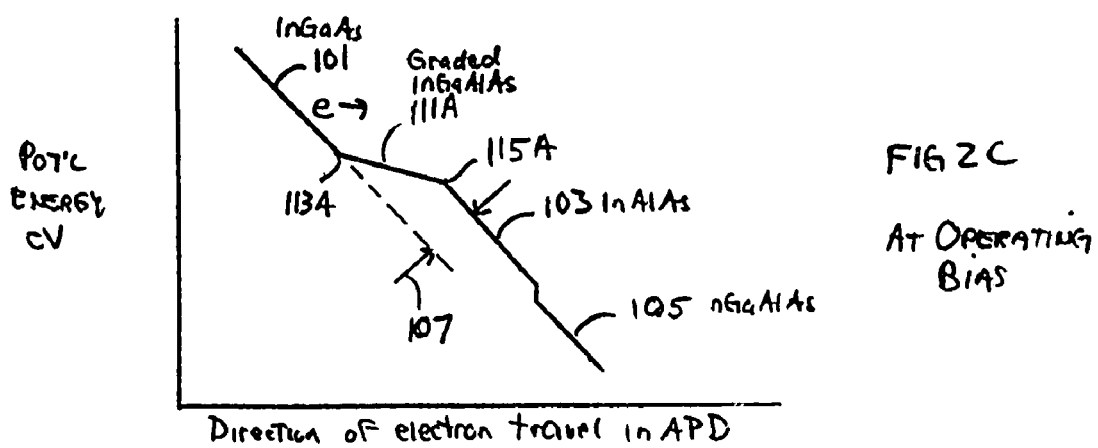
FIG. 2C is a graphical representation of conduction band energy levels of an APD of the present invention, under an operating bias.

With the use of graded transition region 32, the barrier to electron transport across the heterojunction may be eliminated with sufficient applied bias. Power supply 62 may be used to provide the applied, or, operating bias. Because of conduction band energy level differences between absorption layer 42 and the ternary compound which forms both charge layer 26 and first multiplication layer 22, an effective field opposing electron transport across the graded transition region 32, is produced. This effective field is given by the conduction band energy level differences (at zero bias) between the material used to form absorption layer 42 and the material used to form both charge layer 26 and first multiplication layer 22, divided by thickness 34 of graded transition region 32. For high bandwidth avalanche photodetectors, thickness 34 of graded transition region 32, and the operating bias are chosen such that the applied field across graded transition region 32 exceeds the aforementioned opposing effective field by approximately 20 kV/cm. According to other exemplary embodiments, thickness 34 and the operating bias may be chosen such that the applied field across graded transition region 32 exceeds the effective opposing field by other values. In an exemplary embodiment in which absorption layer 42 is formed of the ternary compound of InGaAs and each of charge layer 26 and first multiplication layer 22 are formed of the ternary compound of InAlAs, graded transition region 32 may be formed of In, Ga, Al and As, and may be referred to generally as InGaAlAs although the relative amounts of the cations which form graded transition region 32 may vary to produce constitutions of essentially InAlAs and InGaAs, for example. FIGS. 2A–2C are conduction band diagrams which together illustrate the effect of such an exemplary graded transition region.

Each of FIGS. 2A, 2B and 2C are graphical representation of conduction band energy levels showing potential energy in eV.

FIG. 2A is a conduction band energy level diagram for an APD without a graded transition region, according to the Prior Art. FIG. 2A is a graphical representation showing the energy levels 101, 103 and 105 of the absorption region, the charge/first multiplication layer, and the second multiplication layer, respectively of such a Prior Art APD. The conduction band energy level of the charge layer and the first multiplication layer are both represented by energy level 103 since these layers are formed of substantially the same material and include essentially the same potential energy. The difference in potential energy between the conduction band energy level of the absorption layer (101) and the conduction band energy level of the charge/first multiplication layer (103), is indicated by gap 107. The abrupt step in conduction band energy levels at the heterojunction is indicated by vertical segment 109.

FIG. 2B is a graphical representation of conduction band energy levels of the absorption, graded transition and multiplication regions of an APD according to the present invention and for the case of zero applied bias. FIG. 2B shows the energy levels 101, 103 and 105 of the absorption region, the charge/first multiplication layer and the second multiplication layer, respectively, of an APD of the present invention that also includes a graded transition region represented by ramp 111 in the conduction band energy level diagram. The composition of the various layers are indicated in FIG. 2B and correspond to the APD shown structurally in FIG. 1, e.g. graded transition region 32. Energy level 103 represents both charge layer 26 and first multiplication layer 22 for reasons set forth above. Because of the graded-bandgap quarternary. InGaAlAs graded transition region of the present invention (feature 32 in FIG. 1), ramp 111 is provided between the conduction band energy level 101 (of absorption layer 42 shown in FIG. 1) and energy level 103. At zero applied bias, an electron traveling in the indicated direction from the absorption layer to the multiplication layers must overcome the graded but still present conduction band energy level difference between point 113 of energy level 101 and point 115 of energy level 103, still spaced vertically apart by gap 107 which may be on the order of 0.475 eV.

FIG. 2C is a conduction band energy level diagram of the absorption, transition, and multiplication regions for the case in which an exemplary operating bias is applied to an APD of the present invention such as was shown in FIG. 2B at zero applied bias. FIG. 2C demonstrates that, in conjunction with graded transition region 32, photogenerated electrons see no potential barrier with sufficient applied bias. The line segments which represents energy levels 101A, 103A and 105A of the absorption layers, the charge/first multiplication layer and the second multiplication layer, respectively, are now sloped downward due to the applied bias. The energy level at point 115A of energy level 103A of the change/first multiplication region, is lower than that of point 113A of the absorption region. Under operating conditions then, the applied bias is used to overcome the previously defined effective field opposing electron transport and generate an electric field such that the potential energy at point 115A (at charge layer 26 of FIG. 1) is lower than that at point 113A (at absorption layer 42 of FIG. 1). As such, the net effective field accelerates electrons from absorption layer 42 to first multiplication layer 22. Referring also to FIG. 1, thickness 34 of graded transition region 32 and the operating bias may be chosen such that the applied field across graded transition region 32 exceeds the effective field opposing electron transport, by approximately 20 kV/cm. Such is intended to be exemplary only and, according to other exemplary embodiments, other excesses may be used.

Referring again to FIG. 1, graded transition region 32 may be a quarternary material disposed between two ternary materials. Graded transition region 32 is a graded-bandgap material. This quarternary material may include at last one of its cations having a molar fraction that varies throughout the region. The molar fraction of one or more of the cations may change gradually from interface 36 formed with absorption layer 42, to interface 38 formed with charge layer 26. The graded-bandgap material includes a region of relatively narrow bandgap material closer to absorption layer 42 and a region of a relatively wide bandgap material being closer to multiplication region 14. In an exemplary embodiment, the bandgap of the material varies gradually to produce a relatively smooth change in bandgap throughout the material, such as illustrated by ramp 111 of FIG. 2B and ramp 111A of FIG. 2C, in which the bandgap increases along the direction from the absorption region to the multiplication region.

In an exemplary embodiment, graded transition region 32 may be formed of the quarternary material of InGaAlAs and the molar fractions of cations Ga and Al may vary along the direction from interface 36 to interface 38. In the region closest to interface 36 and the absorption layer, a narrow bandgap material is provided which includes a Ga concentration that is maximized and an Al concentration that is minimized. In one exemplary embodiment, the quarternary material may essentially be InGaAs in close proximity to interface 36. In the region of graded transition 32 nearest interface 38 and multiplication region 14, a wide bandgap material in which Ga concentration is minimized and Al concentration is maximized may be provided. In one exemplary embodiment, the quarternary material may substantially be InAlAs in close proximity to interface 38. The graded bandgap quarternary material may be formed using conventional methods and by varying the relative concentrations of source materials throughout the deposition or epitaxial growth processes. Thickness 34 of graded transition region 32 may lie within the range of 500 Å to 0.4 microns, according to one exemplary embodiment, and it may take on other values according to other exemplary embodiments depending upon the dimensions and application of avalanche photodetector 2. As detailed above, thickness 34 is determined, in part, by the operating bias of the APD.

In other exemplary embodiments, graded transition region may be formed of other materials. Moreover, graded transition region 32 may be used in conjunction with APDs other than the APD illustrated in FIG. 1 which shows other features of the present invention. A fundamental concept of the present embodiment is that graded transition region 32 provides a relatively wide bandgap material closer to the multiplication region and a relatively narrow bandgap material closer to the absorption layer.

Referring again to FIG. 1, according to another exemplary embodiment, the present invention provides a P-type dopant profile within absorber layer 42 which improves gain and bandwidth of avalanche photodetector 2. The vast collection of holes is perhaps the most significant factor influencing the high-gain bandwidth of SAM (separate absorption and multiplication) avalanche photodetector structures based on electron injection. The reduction of hole transit time may therefore yield significant improvements in device bandwidth. The present invention provides for hole transit time reduction achieved by the intentional P-doping of absorption layer 42 which has the effect of moving the P-side depletion region edge, the surface at which avalanche-generated holes are collected, closer to multiplication region 14, that is, along direction 46. Without such introduction of P-type dopant impurities, the depletion region would include multiplication region 14, charge layer 26, absorption layer 42 and optional graded transition region 32.

Light is absorbed within absorption layer 42 and photons of the absorbed light create electron-hole pairs. The electrons are urged to drift towards multiplication region 14, that is, along direction 46, due to the doping-gradient-induced electrostatic field within absorption layer 42, provided by the P-type dopant profile of the present invention. To ensure that the primary escape mechanism of electrons photogenerated in the undepleted portion of absorption layer 42 is drift rather than diffusion, an advantageous condition for high bandwidth performance at every level of gain, the dopant profile of P-type dopant impurities in the absorber is designed such that absorption layer 42 includes a concentration gradient of P-type dopant impurities that decreases along direction 46. In one exemplary embodiment, absorption layer 42 may be formed of InGaAs and the P-type dopant impurities may be zinc (Zn) or carbon (C), but other suitable absorption layers and P-type impurities may be used in other exemplary embodiments. Conventional methods may be used to introduce dopant impurities into absorption layer 42 and to provide a dopant profile, such as described herein. Ion implantation may be used or the P-type dopant impurities may be added during the film formation process used to form absorber layer 42. In one exemplary embodiment, the dopant profile may decrease linearly along direction 46. According to another exemplary embodiment, the dopant profile in absorber layer 42 may be designed according to the following inequality expression.

$$\frac{k_B T}{q} \frac{\partial}{\partial x} \ln(N_A(x)) \geq 3 \text{ kV/cm}$$

Expression 1

According to one exemplary embodiment, the dopant profile of P-type dopant impurities within absorber layer 42 may be designed according to the following inequality expression.

$$8 \text{ kV/cm} \geq \frac{k_B T}{q} \frac{\partial}{\partial x} \ln(N_A(x)) \geq 3 \text{ kV/cm}$$

Expression 2

In each of Expressions 1 and 2, $k_B$ is the Boltzmann constant $1.38 \times 10^{-23}$ joules/° Kelvin, T represents the operating temperature of the APD in degrees Kelvin, q is the fundamental unit of charge equal to $1.602 \times 10^{-19}$ coulombs, NA represents dopant impurity concentration, and x is the linear distance coordinate within absorption layer 42. In the examplary embodiment, x represents distance from interface 36.

According to this exemplary embodiment, the P-type dopant impurity ions such as Zn or C, remains in fixed position according to the aforementioned dopant concentration profiles, while some of the holes associated with these ions diffuse from high concentration areas to low concentration areas to provide a slight polarization. The static field implied by the dopant concentration gradient in undepleted material may advantageously be sufficiently large to accelerate electrons to high velocities within absorption layer 42.

According to another exemplary embodiment, the present invention provides a two-layer multiplication region. Referring still to FIG. 1, multiplication region 14 includes first multiplication layer 22 and second multiplication layer 16. First multiplication layer 22 includes thickness 24 and second multiplication layer 16 includes thickness 18, giving multiplication region 14 total thickness 20. First multiplication layer 22, disposed closer to absorption layer 42, is a relatively wide bandgap material in which some avalanche multiplication takes place. First multiplication layer 22 serves the dual function as a "launching pad" for electrons entering narrower-bandgap second multiplication layer 16. Second multiplication layer 16 is formed to include a narrower bandgap, in particular, a bandgap intermediate between that of absorption layer 42 and first multiplication region 22. Electrons incident on this region from first multiplication layer 22 experience an abrupt increase in energy with respect to conduction band edge and, hence, an abrupt increase in ionization probability, thereby enhancing the process of avalanche multiplication. Unlike conventional designs which may include a multiplication region that includes only a single wide-bandgap material or a superlattice including a multiplicity of very thin layers, the multiplication region of the present invention includes two layers having a combined thickness 20 which may range from 0.1 to 0.2 microns in one exemplary embodiment, and may be greater than 0.2 microns in other exemplary embodiments. In one exemplary embodiment, each of first multiplication layer 22 and second multiplication layer 16 may include a thickness of at least 0.1 micron. Because of its substantial thickness, multiplication region 14 of the present invention maintains electrons in the wider bandgap first multiplication layer 22 and narrower bandgap second multiplication region 16 for a longer period of time that is sufficient to advantageously exploit the instant increase in input ionization probability of an accelerated electron.

In an exemplary embodiment, first multiplication layer 22 may be a wide-bandgap ternary material such as InAlAs and second multiplication layer 16 may be a narrower bandgap quarternary region such as InGaAlAs. Electron multiplication first occurs in wide-bandgap first multiplication layer 22, but as such electrons enter the narrower-bandgap second multiplication region 16, they gain an amount of kinetic energy instantly, which is substantially equivalent to the conduction band discontinuity energy. This instantaneous realization of kinetic energy is associated with an instantaneous increase in impact ionization probability, as the threshold energy for this process is lower in the narrower-bandgap material. This results in a higher gain at a given bias than a comparable device in which multiplication region 14 consists of only a single wide-bandgap multiplication layer. The partitioned multiplication region of the present invention advantageously exhibits greater gain per unit length and per unit of applied bias than alternative, conventional multiplication region structures.

According to an exemplary embodiment, charge layer 26 is formed of the same material as first multiplication layer 22. According to one exemplary embodiment, each may be formed of InAlAs. Charge layer 26 is heavily doped to effect an abrupt step in electric field strength. The effect of the charge layer is to provide a favorable downward slope in the conduction band energy level diagram, such as shown in FIG. 2C. The electric field produced by the highly doped charge layer 26 produces an exaggerated slope (not shown) just past point 115A along the direction of electron travel. Charge layer 26 is chosen to be relatively thin compared to multiplication region 14. In one exemplary embodiment in which thickness 20 of multiplication region 14 is 0.2 microns or greater, charge layer 26 may include thickness 28 being 10% or less of thickness 20.

The foregoing exemplary embodiments are intended to be illustrative and not restrictive of the present invention. The various exemplary features of the present invention may be applied singularly or in combination to various exemplary avalanche photodetectors.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. An absorption region of an avalanche photodetector, said absorption region having a top and a bottom and including a P-type dopant impurity therein, such that $$\frac{k_B T}{q} \frac{\partial}{\partial x} \ln(N_A(x)) \geq 3 \text{ kV/cm}$$

in which $k_B$ is the Boltzmann constant, T represents operating temperature of said photodetector in degrees Kelvin, q is the fundamental unit of charge, $N_A$ represents concentration of said P-type dopant impurity, and x represents distance from one of said top and said bottom, wherein a charge layer is interposed between said absorption layer and a multiplication region, and said charge layer is formed of substantially the same material as a first multiplication layer disposed adjacent said charge layer.

2. The absorption region of an avalanche photodetector as in claim 1, in which said absorption region is a layer of InGaAs.

3. The absorption region of an avalanche photodetector as in claim 1, wherein said P-type dopant impurity comprises one of zinc and carbon.

4. The absorption region of an avalanche photodetector as in claim 1, further including a multiplication layer disposed beneath said absorption region and in which said x represents distance from said bottom.

5. An avalanche photodetector comprising an absorption layer having a top and a bottom, a multiplication region disposed facing said bottom and including at least one multiplication layer, and a charge layer interposed between said absorption layer and said multiplication region and formed of substantially the same material as a first multiplication layer disposed adjacent said charge layer, said absorption layer including a P-type impurity therein, wherein said P-type impurity comprises one of zinc and carbon, and a P-type impurity concentration gradient such that said P-type impurity concentration decreases from said top to said bottom and satisfies $$\frac{k_B T}{q} \frac{\partial}{\partial x} \ln(N_A(x)) \geq 3 \text{ kV/cm}$$

in which $k_B$ is the Boltzmann constant, T represents operating temperature of said photodetector in degrees Kelvin, q is the fundamental unit of charge, $N_A$ represents said P-type impurity concentration, and x represents distance from said bottom.

6. The avalanche photodetector as in claim 5, wherein said absorption layer is formed of InGaAs.

7. The avalanche photodetector as in claim 5, in which said absorption layer includes a thickness within the range of 0.1 to 0.6 microns.

8. The avalanche photodetector as in claim 5, wherein said charge layer includes dopant impurities therein.

9. The avalanche photodetector as in claim 6, wherein said charge layer is formed of InAlAs and interposed between said absorption layer and said multiplication region, said multiplication region composed of an InAlAs multiplication layer disposed adjacent said charge layer and an InGaAlAs multiplication layer.

10. The avalanche photodetector of claim 9, in which said P-type impurity concentration gradient satisfies $$8 \text{ kV/cm} \geq \frac{k_B T}{q} \frac{\partial}{\partial x} \ln(N_A(x)) \geq 3 \text{ kV/cm}$$

in which $k_\beta$ is the Boltzmann constant, T represents operating temperature of said photodetector in degrees Kelvin, q is the fundamental unit of charge, $N_A$ represents said P-type impurity concentration, and x represents distance from said bottom.

11. The avalanche photodetector as in claim 5, further comprising a graded transition region disposed between said absorption layer and said multiplication region, said graded transition region being a graded-bandgap material, including a graded conduction band energy level that produces a gradual change between a first conduction band energy level of said absorption layer and a second conduction band energy level of said multiplication region.

12. An avalanche photodetector comprising an absorption layer, a multiplication region and a charge layer disposed between said multiplication region and said absorption layer, said multiplication region consisting of only two multiplication layers including a first multiplication layer formed of a relatively wide bandgap material and disposed closer to said absorption layer and a second multiplication layer formed of a relatively narrow bandgap material and disposed further from said absorption layer, said first multiplication layer and said second multiplication layer having a combined thickness of at least 0.2 microns and a charge layer thickness is no greater than 10% of said combined thickness, and wherein said first multiplication layer is formed of substantially the same material as said charge layer.

13. The avalanche photodetector as in claim 12, wherein said charge layer includes dopant impurities therein to produce an abrupt step in electric field strength.

14. The avalanche photodetector as in claim 12, wherein said charge layer and said first multiplication layer are formed of InAlAs, said second multiplication layer is formed of InGaAlAs, and said absorption layer is formed of InGaAs.

15. The avalanche photodetector as in claim 12, further comprising a graded transition region disposed between said absorption layer and said charge layer, said graded transition region being a graded-bandgap material including a graded conduction band energy level that produces a gradual change between a first conduction band energy level of said absorption layer and a second conduction band energy level of said first multiplication layer.

16. The avalanche photodetector as in claim 12, in which said absorption layer includes a top and a bottom facing said multiplication region and includes a P-type impurity therein, said absorption layer including a P-type impurity concentration gradient decreasing from said top to said bottom.

17. The avalanche photodetector as in claim 12, in which each of said first multiplication layer and said second multiplication layer includes a thickness of at least 0.1 micron.

* * * * *